United States Patent
Chiou et al.

(10) Patent No.: US 8,286,051 B2
(45) Date of Patent: Oct. 9, 2012

(54) METHOD AND APPARATUS FOR BURST ERROR DETECTION AND DIGITAL COMMUNICATION DEVICE

(75) Inventors: Rong-Liang Chiou, Hsinchu (TW); Ming-Luen Liou, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 1059 days.

(21) Appl. No.: 12/206,121

(22) Filed: Sep. 8, 2008

(65) Prior Publication Data

US 2009/0006928 A1    Jan. 1, 2009

Related U.S. Application Data

(63) Continuation-in-part of application No. 11/675,664, filed on Feb. 16, 2007, now Pat. No. 7,865,812, and a continuation-in-part of application No. 11/684,029, filed on Mar. 9, 2007, now Pat. No. 7,890,847, and a continuation-in-part of application No. 11/160,927, filed on Jul. 15, 2005, now Pat. No. 7,673,222, and a continuation-in-part of application No. 11/161,014, filed on Jul. 19, 2005, now Pat. No. 7,603,591.

(51) Int. Cl.
*H03M 13/00* (2006.01)

(52) U.S. Cl. ......... 714/755; 714/762; 714/786; 714/788

(58) Field of Classification Search .................. 714/755, 714/762, 786, 788
See application file for complete search history.

(56) References Cited

U.S. PATENT DOCUMENTS

| | | | |
|---|---|---|---|
| 4,653,052 A | 3/1987 | Doi | |
| 5,206,864 A * | 4/1993 | McConnell | 714/755 |
| 5,434,886 A | 7/1995 | Kazawa et al. | |
| 5,708,665 A | 1/1998 | Luthi et al. | |
| 5,715,262 A | 2/1998 | Gupta | |
| 5,812,603 A | 9/1998 | Luthi et al. | |
| 5,937,016 A | 8/1999 | Choi | |
| 5,968,198 A | 10/1999 | Hassan et al. | |
| 5,996,103 A | 11/1999 | Jahanghir | |
| 6,011,817 A | 1/2000 | Bergmans et al. | |
| 6,044,485 A | 3/2000 | Dent et al. | |
| 6,108,811 A | 8/2000 | Nakamura et al. | |
| 6,209,112 B1 | 3/2001 | Stevenson | |
| 6,446,236 B1 * | 9/2002 | McEwen et al. | 714/795 |
| 6,728,323 B1 | 4/2004 | Chen et al. | |
| 6,732,326 B2 | 5/2004 | Choi et al. | |
| 7,047,474 B2 | 5/2006 | Rhee et al. | |
| 7,065,696 B1 | 6/2006 | Liu et al. | |
| 7,131,055 B2 | 10/2006 | Mathew et al. | |
| 7,236,536 B2 | 6/2007 | Hochwald et al. | |

(Continued)

OTHER PUBLICATIONS

Office Action mailed in related U.S. Appl. No. 11/160,927.

*Primary Examiner* — Guy Lamarre

(74) *Attorney, Agent, or Firm* — Thomas|Kayden

(57) ABSTRACT

A digital communication device is provided for decoding a data stream to generate a receiver output. In the digital communication device, a burst error detector determines burst noise locations corresponding to the data stream according to an error-check equation and accordingly generates a burst error indicator. Thereafter, an inner decoder decodes the data stream to generate an inner decoded stream, comprising an erasure marker for performing an erasure marking process on the inner decoded stream based on the burst error indicator to generate an erasure indicator corresponding to the inner decoded stream. An outer decoder then decodes the inner decoded stream with reference to the erasure indicator to generate the receiver output.

27 Claims, 15 Drawing Sheets

U.S. PATENT DOCUMENTS

| | | |
|---|---|---|
| 7,237,173 B2 | 6/2007 | Morita et al. |
| 7,478,306 B2 | 1/2009 | Okamoto et al. |
| 2003/0026028 A1 | 2/2003 | Ichihara et al. |
| 2003/0192001 A1 | 10/2003 | Maiuzzo et al. |
| 2004/0030984 A1 | 2/2004 | Renaud |
| 2004/0061964 A1* | 4/2004 | Akamatsu ............... 360/39 |
| 2005/0022095 A1* | 1/2005 | Lee ............... 714/759 |
| 2005/0078640 A1 | 4/2005 | Kim et al. |
| 2005/0120286 A1 | 6/2005 | Akamatsu |
| 2009/0055717 A1 | 2/2009 | Au et al. |

* cited by examiner

METHOD AND APPARATUS FOR BURST ERROR DETECTION AND DIGITAL COMMUNICATION DEVICE

CROSS REFERENCE TO RELATED APPLICATIONS

This application is a Continuation-In-Part of pending U.S. patent application Ser. No. 11/675,664, filed on 2007 Feb. 16 and entitled "apparatus AND METHOD for Determining A detected punctured position in punctured convolutional codes", Ser. No. 11/684,029, filed 2007 Mar. 9 and entitled "apparatus AND METHOD for calculating error metrics in a digital communication system", Ser. No. 11/160,927 filed on 2005 Jul. 15 and entitled "Error-correcting apparatus including multiple error-correcting modules functioning in parallel and related method", and Ser. No. 11/161,014 filed on 2005 Jul. 19 and entitled "Apparatus selectively adopting different determining criteria in erasure marking procedure when performing decoding process, and method thereof".

BACKGROUND OF THE INVENTION

1. Field of the Invention

The invention relates to digital communication devices, and in particular, to an enhanced error-erasure decoding method applicable to a burst error detection mechanism.

2. Description of the Related Art

In a conventional receiver, various types of noise, distortion, and interference are common factors that deteriorate signal quality to render erroneous outputs. Error-correcting coding (ECC) is a prevalent technique to help a receiver resist the above-mentioned factors, reduce the probability of errors, and enhance the reliability of the outputted data.

Concatenated coding is a kind of error-correcting coding technique that implements multiple levels of coding, such as inner coding and outer coding. For example, convolutional codes or Trellis-Coded-Modulation (TCM) codes could be used as the inner codes, which would help to overcome scattered random errors. Reed-Solomon (RS) codes or BCH codes could be used as the outer codes, which would help to overcome burst errors.

FIG. 1 shows a block diagram of a conventional receiver for decoding concatenated codes. The receiver 100 shown in FIG. 1 comprises a demodulator 110, an inner decoder 120, a deinterleaver 130, and an outer decoder 140. The demodulator 110 receives a radio frequency signal #RF to generate a data stream #S and may comprise components such as synthesizers for frequency down conversion, filters for anti-aliasing, synchronization means for timing or frequency recovery, and an equalizer for compensating for fading or impairment channel effects. After some or all of the above-mentioned operations are performed, the demodulator 110 then generates a data stream #S.

Depending on which kind of inner code is utilized, the inner decoder 120 may be implemented by a convolutional decoder or a TCM decoder, performing inner decoding processes on the data stream #S to generate inner decoded stream #I. Following the inner decoder 120, a deinterleaver 130 deinterleaves the inner decoded stream #I to generate a deinterleaved stream #D. The deinterleaver 130 plays an important role in scattering some kinds of burst noise in order to share the error-correction burden.

The outer decoder 140 performs an outer-decoding process on the deinterleaved stream #D to output receiver output #OUT and could be dependently implemented by an RS decoder or a BCH decoder. For example, when RS codes are utilized as the outer codes, the outer decoder 140 implements an RS error decoder. The outer decoder 140 can correct a maximum of t errors for (n, k, 2t) RS codes. In other words, the outer decoder 140 has an error correction capability of t errors. However, in some communication systems, especially in terrestrial broadcasting systems, complex multi-path channels would induce severe fading or interference so that the equalizer of the demodulator 110 cannot entirely compensate for the fading or interference. In such circumstances, burst noise may cause errors on the inner decoder 120 to propagate to the outer decoder 140, wherein even the deinterleaver 130 cannot scatter them efficiently. Therefore, an erasure marking mechanism is proposed to enhance the capability of error correction.

If the demodulator 110 is able to detect burst noise, and the inner decoder 120 has a mechanism to mark unreliable symbols as erasure indicators, the outer decoder 140 can be upgraded to an RS error-erasure decoder. An RS error-erasure decoder can correct x errors and y erasures for (n, k, 2t) RS codes, only if $2x+y \leq 2t$. In other words, the outer decoder 140 has the opportunity to correct codewords with an actual error number that is larger than t if it is informed with some error locations marked as erasures.

An erasure marking procedure must be performed based on a reliable burst error detection, however, the burst error detection mechanism is currently a preliminary technique. It is therefore desirable to provide an enhanced burst error detector.

BRIEF SUMMARY OF THE INVENTION

An exemplary embodiment of a digital communication device is provided for decoding a data stream to generate a receiver output. In the digital communication device, a burst error detector determines burst noise locations corresponding to the data stream according to an error-check equation and accordingly generates a burst error indicator. Thereafter, an inner decoder decodes the data stream to generate an inner decoded stream, comprising an erasure marker for performing an erasure marking process on the inner decoded stream based on the burst error indicator to generate an erasure indicator corresponding to the inner decoded stream. An outer decoder then decodes the inner decoded stream with reference to the erasure indicator to generate the receiver output.

Another embodiment provides a method for decoding the data stream to generate the receiver output. Firstly, burst noise locations corresponding to the data stream are determined according to an error-check equation and accordingly generating a burst error indicator. The data stream is then decoded to generate an inner decoded stream. An erasure marking process is simultaneously performed on the inner decoded stream based on the burst error indicator to generate an erasure indicator corresponding to the inner decoded stream. The inner decoded stream is then decoded with reference to the erasure indicator to generate the receiver output. A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3b shows an embodiment of a statistics unit 330 according to the embodiment in FIG. 3a;

FIG. 3c shows another embodiment of a statistics unit 330 according to the embodiment in FIG. 3a;

FIG. 4b shows embodiments of a decision unit 310a and a combinational logic unit 320a responsive to the inner encoder 400 in FIG. 4a;

FIG. 5b shows a punctured binary convolutional encoder 520a according to the inner encoder 500 in FIG. 5a;

FIG. 5d shows a punctured binary convolutional encoder 520d according to the inner encoder 500 in FIG. 5a;

FIG. 7a shows an embodiment of an outer decoder 240a; and

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
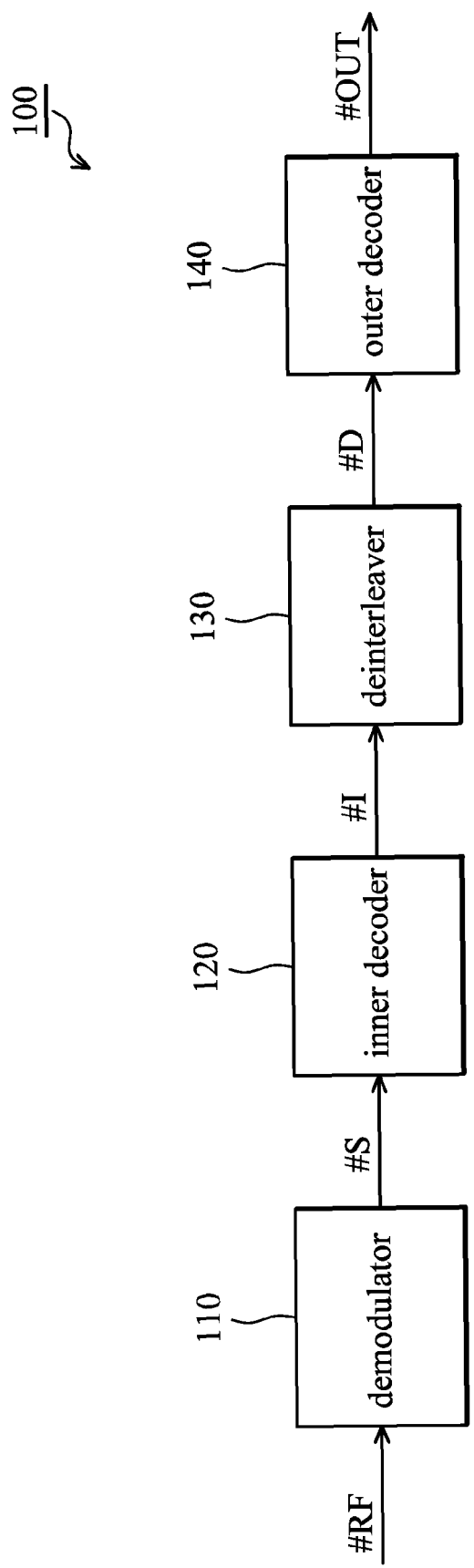
FIG. 1 shows a conventional receiver.
Figure 2A:
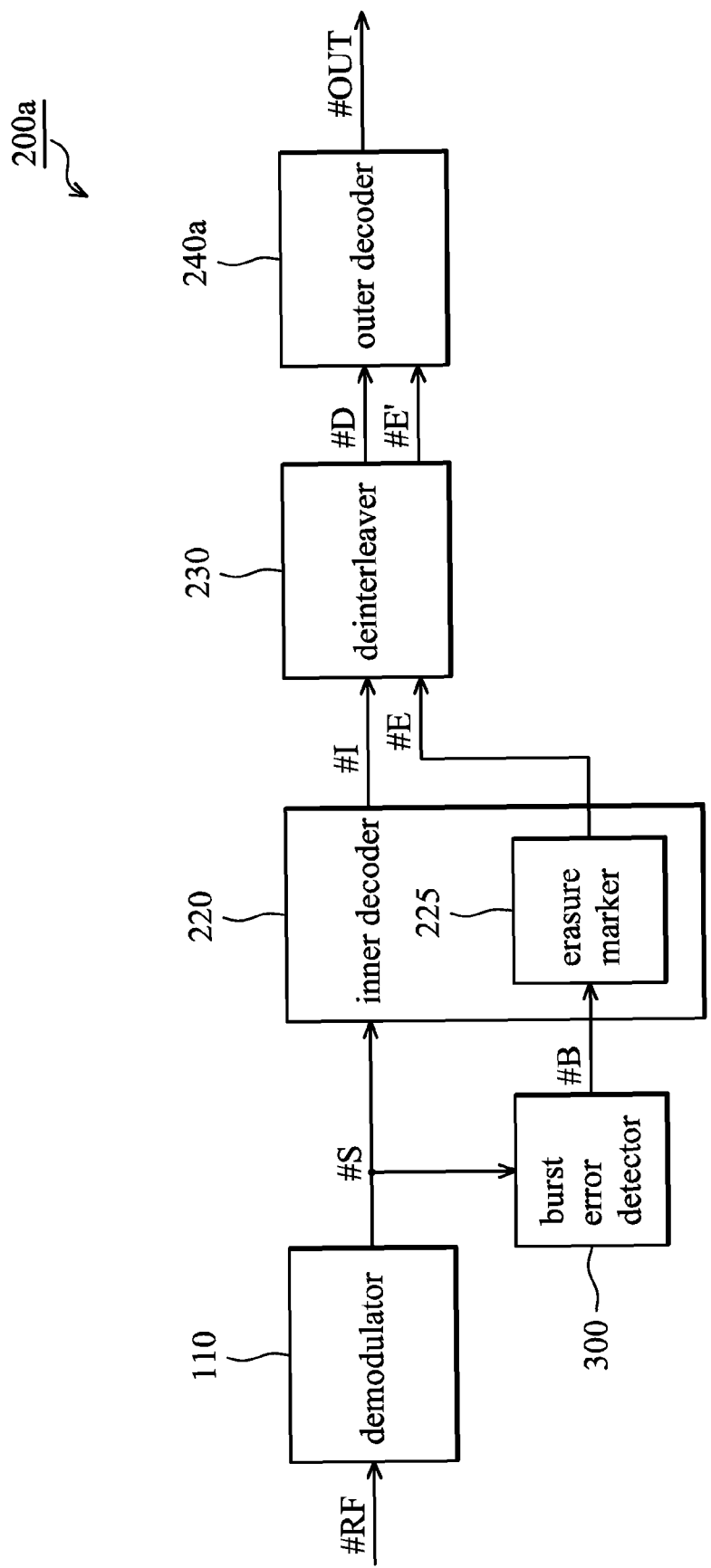
FIG. 2a shows an embodiment of a digital communication device according to the invention.

FIG. 2a shows an embodiment of a digital communication device 200a according to the invention. In the embodiment, a burst error detector 300 is provided to detect burst error based on the data stream #S output from the demodulator 110. The inner decoder 220 adapts an erasure marker 225 to output an erasure indicator #E based on burst error indicator #B output from the burst error detector 300. More specifically, the erasure marker 225 maps burst error indicator #B in a symbol level to corresponding bits while the inner decoder decodes the data stream #S into recovered bits. The deinterleaver 230 deinterleaves the erasure indicator #E to output a deinterleaved erasure indicator #E' to the outer decoder 240a while converting the inner decoded stream #I into a deinterleaved stream #D. The outer decoder 240a then performs an adaptive error correction process based on the deinterleaved stream #D and deinterleaved erasure indicator #E' to output the receiver output #OUT.

Figure 2B:
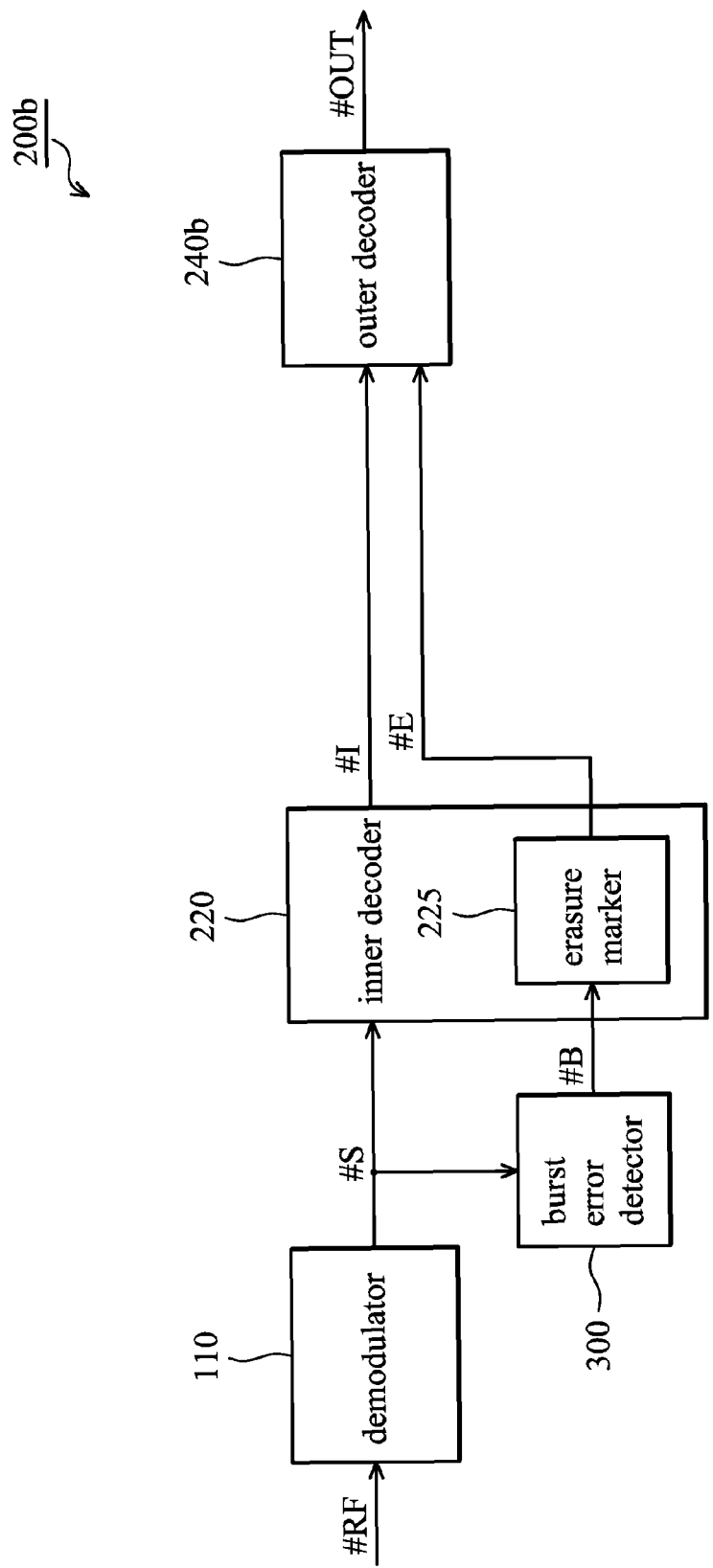
FIG. 2b shows another embodiment of a digital communication device according to the invention.

Depending on the structure of the transmitter generating the radio frequency signal #RF, it is noted that to the deinterleaver 230 is optional component. FIG. 2b shows another embodiment of a digital communication device 200b where the deinterleaver 230 is not present in the digital communication device 200b. As shown, the inner decoder 220 provides the inner decoded stream #I and the erasure indicator #E to the outer decoder 240b. The outer decoder 240b then performs the adaptive error correction process based on the inner decoded stream #I and erasure indicator #E to output the receiver output #OUT. Detailed operations of each function block are further described below.

Figure 3A:
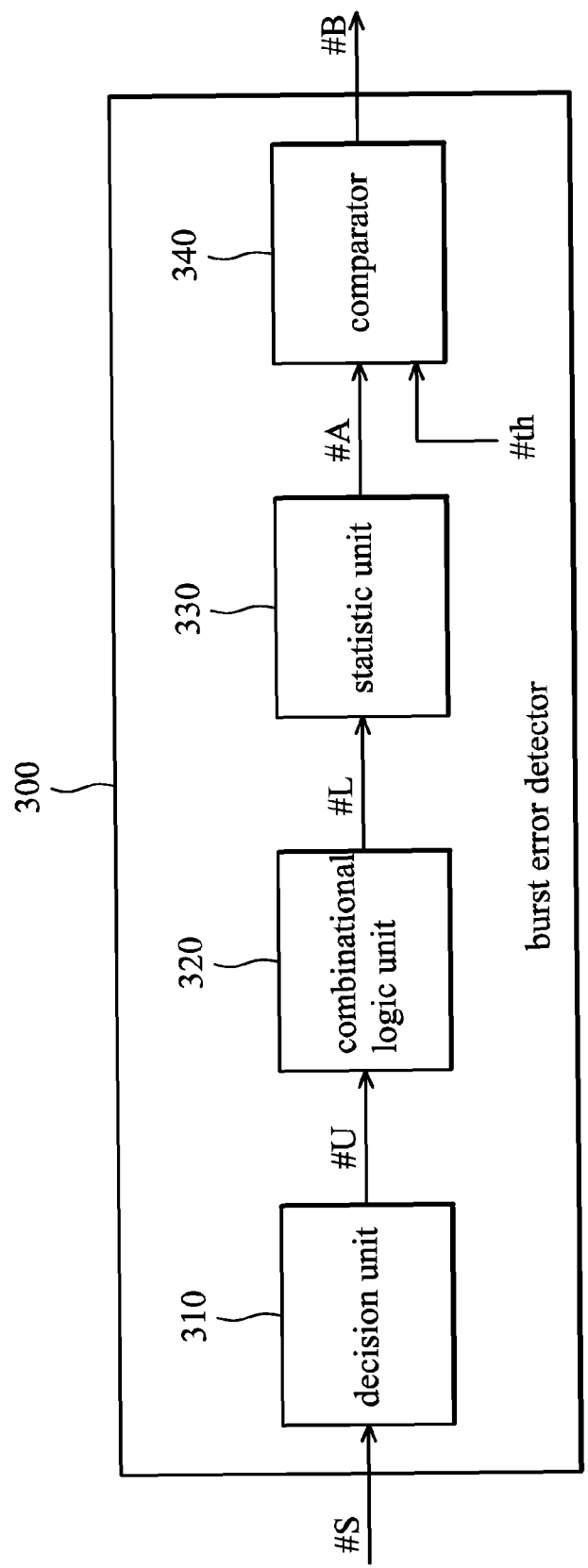
FIG. 3a shows an embodiment of a burst error detector 300 according to the invention.

FIG. 3a shows an embodiment of the burst error detector 300 as shown in FIGS. 2a and 2b. The data stream #S is a continuous bit stream sequentially input to the burst error detector 300 at a certain bit rate. The burst error detector 300 analyzes the data stream #S to generate a burst error indicator #B to indicate whether burst error has occurred on a corresponding timing period. In the burst error detector 300, a decision unit 310 slices or quantizes the data stream #S, and extracts useful bits from the data stream #S to generate at least one coded stream #U. The useful bits are directed to parity bits or error check codes embedded with data bits in the data stream #S, and the formats are dependent on various coding schemes which will be described below. For example, the data stream #S may be a symbol stream, thus the decision unit 310 serves as a slicer or a quantizer, and the coded stream #U is output as a coded bit stream. Alternatively, if the data stream #S is provided as parallel coded bits, the coded stream #U can be a serial coded bit stream.

The combinational logic unit 320 couples to the output of the decision unit 310, performing a combinational logic operation on the coded stream #U based on an error-check equation to generate a logic value #L for indicating correctness of a certain plurality of coded stream #U within a certain time period. In the embodiment, the error-check equation is developed by a particular algorithm associated with the coding scheme applied on the digital communication device 200. The error-check equation varies with the applied coding scheme, and can be previously determined or approximated by the known structure of the corresponding transmitter. As the data stream #S are sequentially input, the logic value #L is consecutively output per time slot, each corresponding to a certain plural of coded stream #U.

Following the combinational logic unit 320, a statistics unit 330 compiles a plurality of consecutive logic value #Ls within a time period to generate an accumulated value #A. A time period is directed to a group of consecutive time slots offsetting with time. The logic value #L is sequentially generated per time slot. Meanwhile, an accumulated value #A is preferably referred to as a summary of a plurality of logic value #Ls within consecutive time slots.

A comparator 340 is coupled to the statistics unit 330, comparing the accumulated value #A with a threshold level #th to detect whether a burst error has occurred. If the accumulated value #A exceeds the threshold level #th, the comparator 340 asserts a burst error indicator #B to a particular value, such as logic "1" to indicate that a burst error has recently occurred. Conversely, if the accumulated value #A does not exceed the threshold level #th, the burst error indicator #B is set to a logic "0". The threshold level may be a fixed value, a single-level value, or a multi-level value. Some other approach may be adapted to provide an adaptive threshold level.

Figure 3B:
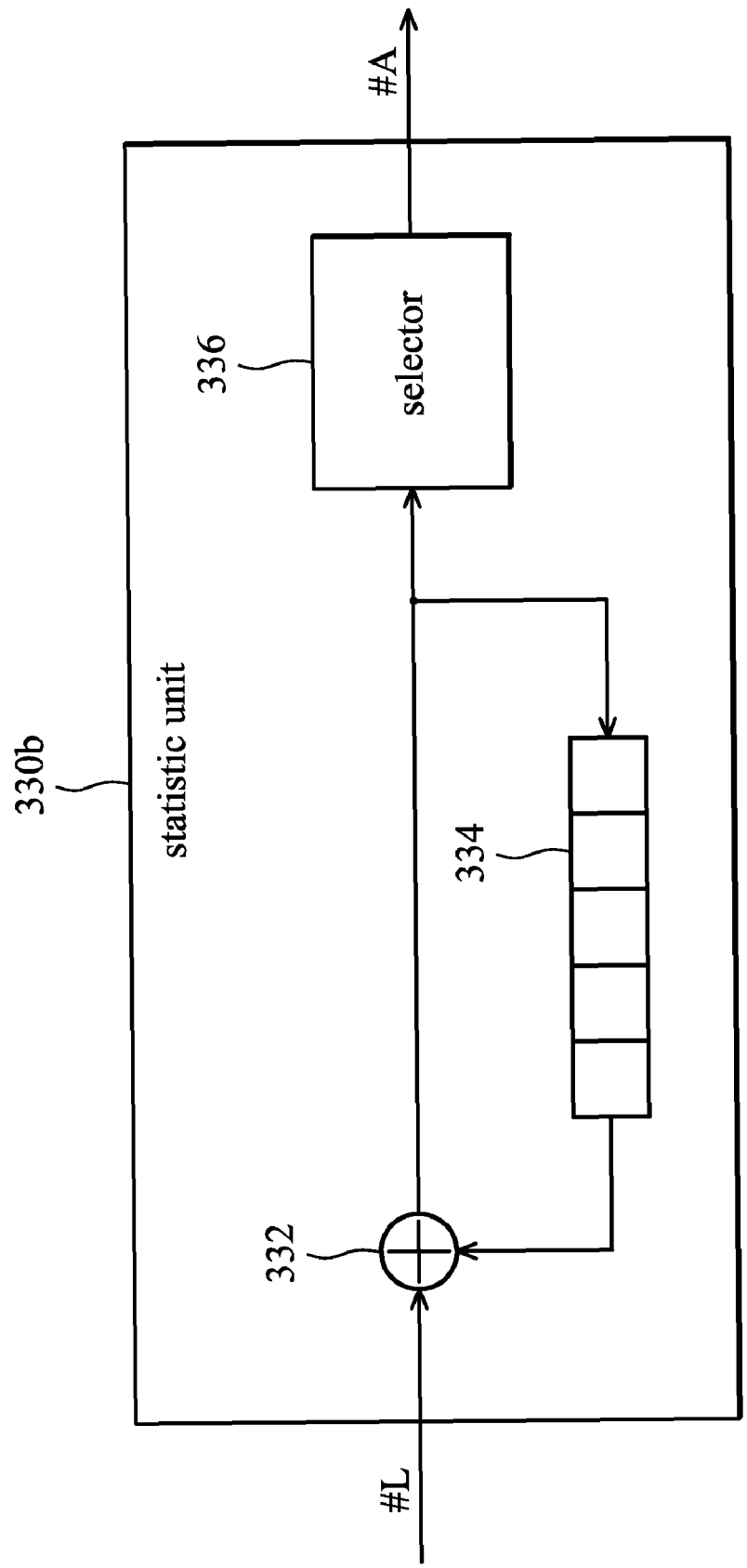

FIG. 3b shows an embodiment of a statistics unit 330b according to FIG. 3a. According to the standard of convolutional codes, the coded stream #U in the data stream #S are segmented by a coding period (time period), and in the statistics unit 330b, a delay line 334 is designated to present the coding period (time period), comprising a plurality of columns each corresponding to a slot in the time period wherein each column storing a logic value #L. The adder 332 sequentially receives the logic value #L from the combinational logic unit 320 to accumulate each column of the delay line 334. Thereafter, a selector 336 detects the segmentation boundary (puncture boundary) of the coded stream #U and outputs one of the accumulated column values corresponding to the segmentation boundary (puncture boundary) as the accumulated value #A. The mechanism to detect the segmentation boundary can be obtained from various prior arts and therefore is not introduced herein.

In the statistics unit 330, the accumulations for each column of the delay line 334 may be repeated for one or more time periods (coding periods of the coded stream #S), and the selector 336 may selects one of the columns of the delay line 334 having a minimal preliminary accumulation result as the boundary. The selector 336 then outputs the preliminary accumulation result as the accumulated value #A based on the boundary.

Figure 3C:
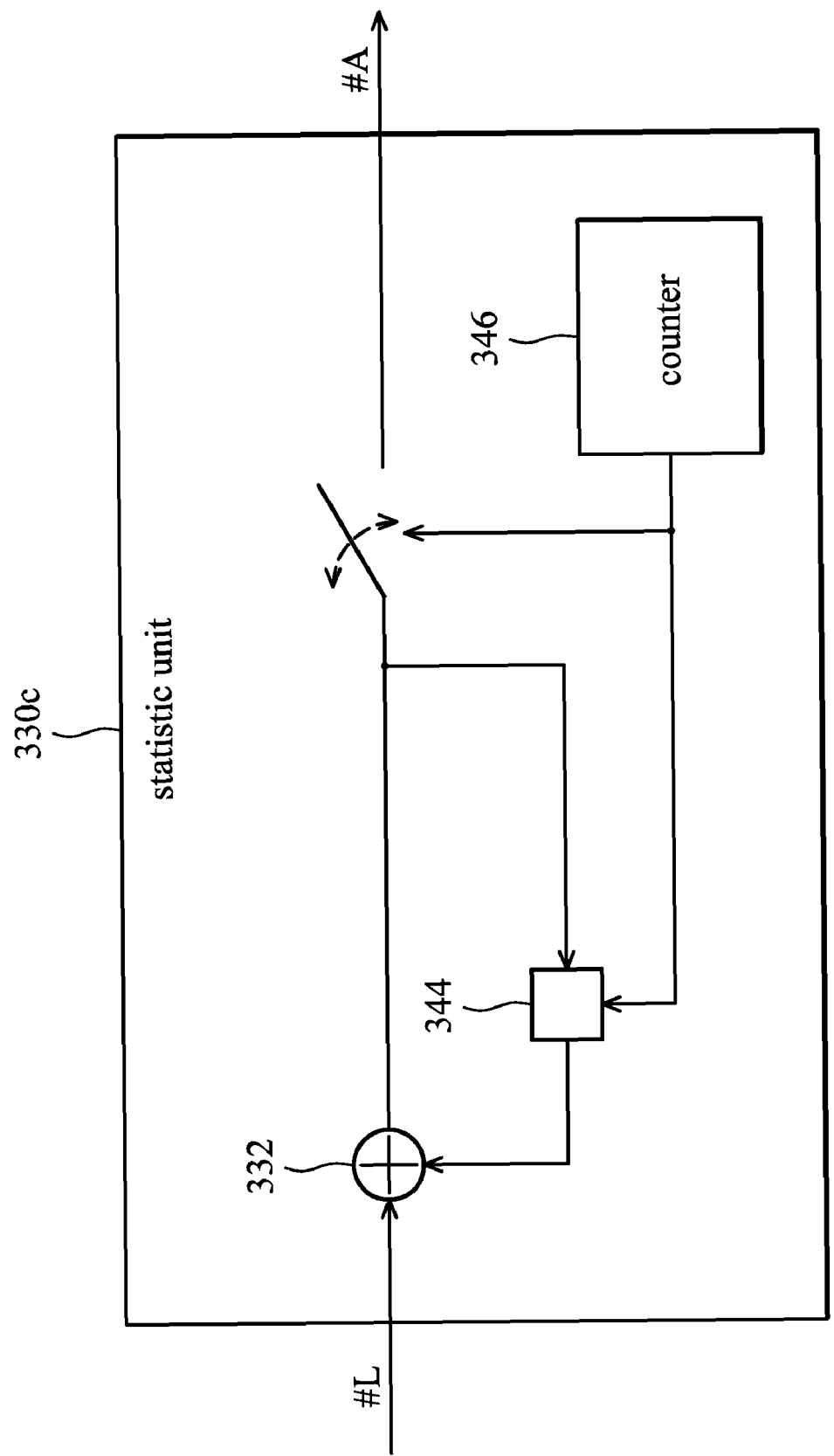

FIG. 3c shows another embodiment of a statistics unit 330c according to FIG. 3a. Similarly, the coded stream #U in the data stream #S are segmented by a coding period (time period), and in the statistics unit 330c, a storage element 344, such as a buffer, stores a preliminary accumulation result of the accumulated value #A. The adder 332 receives logic value #L from the combinational logic unit 320 and the preliminary accumulation result from the storage element 344 to sequentially sum each input logic value #L with the preliminary accumulation result and accordingly store the result of summation in storage element 344 as the preliminary accumulation result. A counter 346 counts a time period (coding periods of the coded stream #S), thereby enabling output of the preliminary accumulation result in the storage element 344 as the accumulated value #A. The counter 346 then reset the preliminary accumulation result storing in the storage element 344.

Figure 4A:
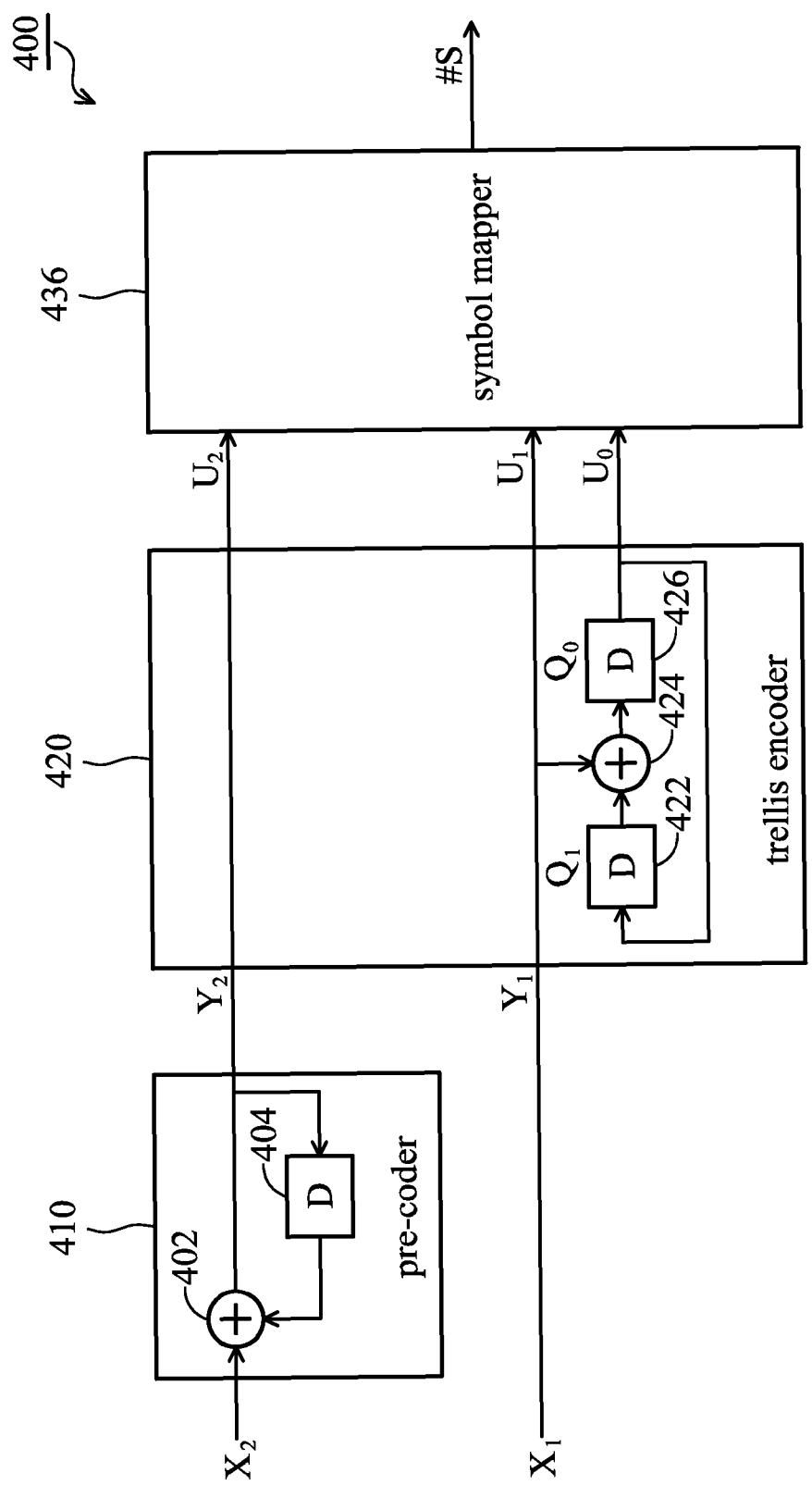
FIG. 4a shows a conventional inner encoder 400.

FIG. 4a shows a conventional inner encoder 400. The inner encoder 400 is a TCM block of the transmitter complying with the 8-VSB standard, which includes a pre-coder 410, a trellis encoder 420 and a symbol mapper 436. The pre-coder 410 receives two information bit streams $X_1$ and $X_2$ and generates two bit streams $Y_1$ and $Y_2$, respectively. The pre-coder 410 has an XOR gate 402 and a delay element 404 with a 12-symbol delay period, and receives the bit stream $X_2$ to generate the bit stream $Y_2$. The trellis encoder 420 receives two bit streams $Y_1$ and $Y_2$ and generates three output bit streams $U_0$, $U_1$ and $U_2$. The trellis encoder 420 has an XOR gate 424 and two delay elements 422 and 426 each having a 12-symbol delay period, which receive the bit stream $Y_1$ and generate the output bit stream $U_0$ and $U_1$. The symbol mapper 436 receives three output bit streams $U_0$, $U_1$ and $U_2$, and generates a data stream #S using a predetermined symbol mapping rule defined by the 8-VSB standard.

In the trellis encoder 420, the output bit streams $U_0$ and $U_1$ are determined by the bit stream $Y_1$ using the XOR gate 424 and the two delay elements 422 and 426. According to the structure of the trellis encoder 420, three equations, which involve the output bit streams $U_0$ and $U_1$ but are irrelevant to the bit stream $Y_0$, can be determined; they are as follows:

$$U_0[n]=Q_0[n-1]; \quad (1)$$

$$Q_0[n]=U_1[n] \oplus Q_1[n-1]; \quad (2) \text{ and}$$

$$Q_1[n-1]=U_0[n-1], \quad (3)$$

where n represents an index and each increment corresponds to a 12-symbol delay period, and $Q_0$ and $Q_1$ represent the outputs of the delay elements 422 and 426, respectively.

Thus, an identity, $U_0[n+1]=U_1[n] \oplus U_0[n-1]$, can be deduced based on equations (1), (2) and (3). Accordingly, the error-check equation is determined as follows:

$$P[n]=U_0[n+1] \oplus U_1[n] \oplus U_0[n-1] \quad (4).$$

Using the error-check equation (4) inherent in the transmitter complying with the 8-VSB standard, an apparatus for calculating an error metric can be designed. A P[n] of a logic value "0" indicates correctness of corresponding coded stream #U. Conversely, a P[n] of logic "1" indicating incorrectness of the corresponding coded stream #U.

Figure 4B:
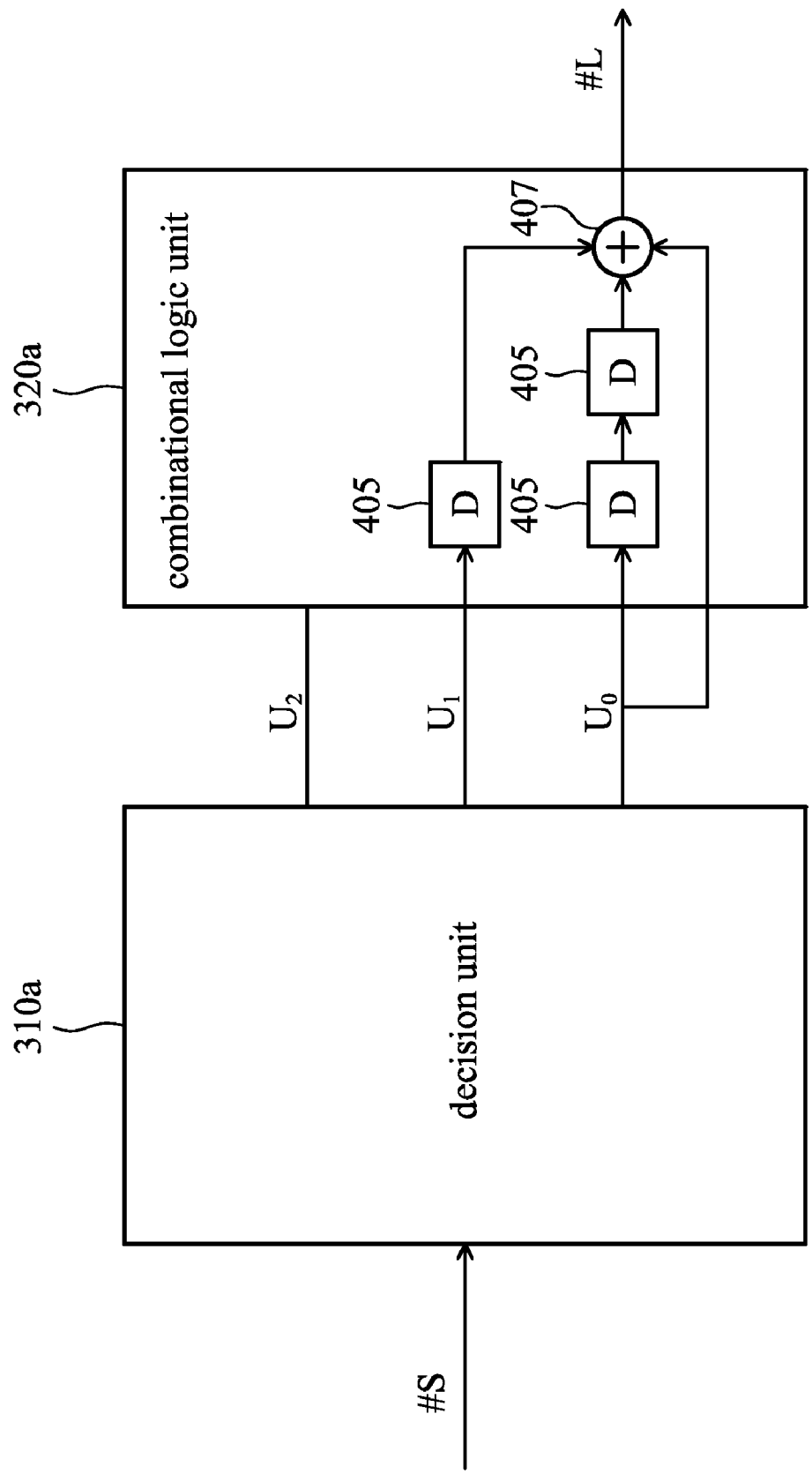

FIG. 4b shows embodiments of a decision unit 310a and a combinational logic unit 320a responsive to the inner encoder 400 in FIG. 4a. In the combinational logic unit 320a, the delay elements 405 and the XOR gate 407 constitute the combinational logic unit 320 shown in FIG. 3a. The decision unit 310a and combinational logic unit 320a are adapted in the embodiment of FIG. 3a to form a burst error detector 300.

As an example, the data stream #S, which generally comes from an equalizer in the demodulator 110, is inputted to the decision unit 310a. The decision unit 310a generates three coded streams $U_0$, $U_1$ and $U_2$ using the symbol mapping rule symmetric to the symbol mapper 436 of the inner encoder 400 in FIG. 4a. If the coded streams $U_0$, $U_1$ and $U_2$ are correct, it is assumed that the corresponding symbol in the data stream #S is also correct. Thus, the delay elements 405 in the combinational logic unit 320a can be used to simplify the equation (4), whereby the coded stream $U_1$ is delayed with a 12-symbol period, and the coded stream $U_0$ is delayed with a 24-symbol period. An XOR gate 407 then receives the delayed coded streams $U_0$ and $U_1$ to implement the error checking operations, and the logic value #L output from the XOR gate 407 represents an error checking result. Apparently, in this embodiment, a logic value "0" represents a correct trial, and a logic value "1" represents an incorrect trial.

Figure 5A:
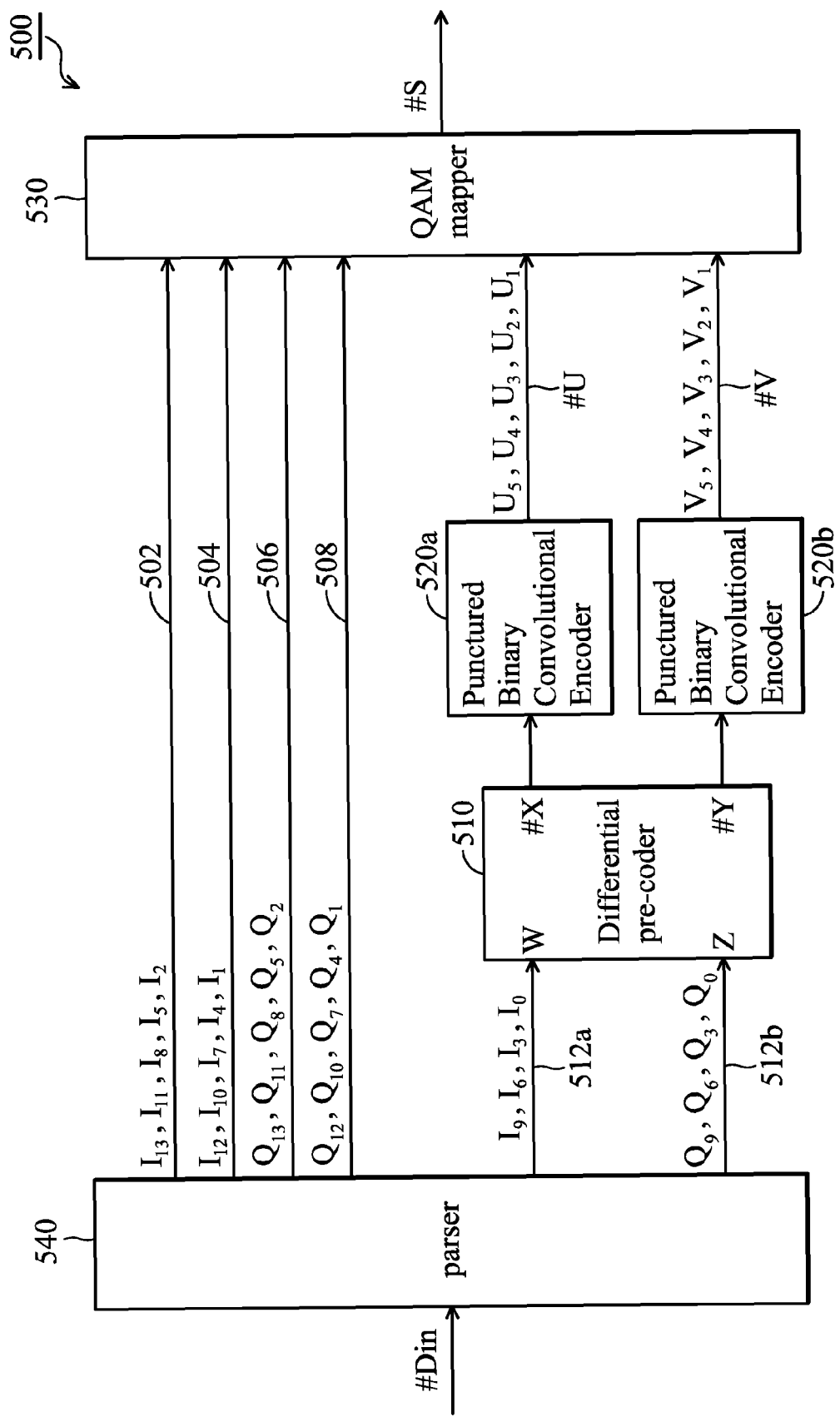
FIG. 5a shows a conventional inner encoder 500.

FIG. 5a shows a conventional inner encoder 500. The inner encoder 500 is a TCM block in a transmitter complying with the standard of the ITU-T Recommendation J.83 Annex B. (hereinafter called J83B) which utilizes the 64-QAM modulation scheme. In FIG. 5a, the inner encoder 500 serially receives a 7-bit data stream #Din. The parser 540 identifies a group of four 7-bit symbols (i.e. 28 bits) and assigns as an in-phase "I" component and a quadrature "Q" component. As indicated in FIG. 5a, for the I component, the parser 540 outputs two upper uncoded bit streams 502 ($I_2$, $I_5$, $I_8$, $I_{11}$, $I_{13}$) and ($I_1$, $I_4$, $I_7$, $I_{10}$, $I_{12}$) 504 and one lower coded bit stream 512a ($I_0$, $I_3$, $I_6$, $I_9$). For the Q component, the parser 540 outputs two upper uncoded bit streams 506 ($Q_2$, $Q_5$, $Q_8$, $Q_{11}$, $Q_{13}$) and 508 ($Q_1$, $Q_4$, $I_7$, $Q_{10}$, $Q_{12}$) and one lower coded bit stream 512b ($Q_0$, $Q_3$, $Q_6$, $Q_9$). The uncoded bit streams 502, 504, 506 and 508 are sent to a QAM mapper 530, and the coded bit streams 512a and 512b are sent to a differential pre-coder 510. The differential pre-coder 510 performs rotationally invariant trellis coding on I and Q bit pairs, that is, $Q_0$ and $I_0$, $Q_3$ and $I_3$, $Q_6$ and $I_6$, and $Q_9$ and $I_9$. The differential pre-coder 510 then transmits the differentially encoded lower streams #X and #Y (4 bits) to punctured binary convolutional encoders 520a and 520b, respectively.

In the embodiment, the ⅘-rate punctured binary convolutional encoders 520a and 520b are based on ½-rate binary convolutional encoders with punctured codes. Usually, in the digital communication system, error correction codes are applied add redundancy to upgrade anti-noise capability. With the ½ code rate, the punctured binary convolutional encoders 520a and 520b receive four bits (#X and #Y) and generate 8 encoded bits. In addition, the puncture function applied in the punctured binary convolutional encoder 520a and 520b is used to compensate for the decrease in payload if all encoded bits are transmitted as the payload will be much reduced due to excessive redundancy. In other words, the transmission of some of the encoded bits previously agreed on by the transmitter and the receiver is bypassed. The punctured binary convolutional encoders 520a and 520b, complying with the J83B standard, transmit 5 bits for every encoded 8 bits, resulting in an overall punctured code rate ⅘. That is, 5 bits are generated according to 4 input bits.

Finally, the QAM mapper 530 receives uncoded bit streams 502, 504, 506 and 508, and the coded streams #U ($U_1$, $U_2$, $U_3$, $U_4$, $U_5$) and #V ($V_1$, $V_2$, $V_3$, $V_4$, $V_5$) from the punctured binary convolutional encoders 520a and 520b, and produces a 64-QAM data stream #S.

Figure 5B:
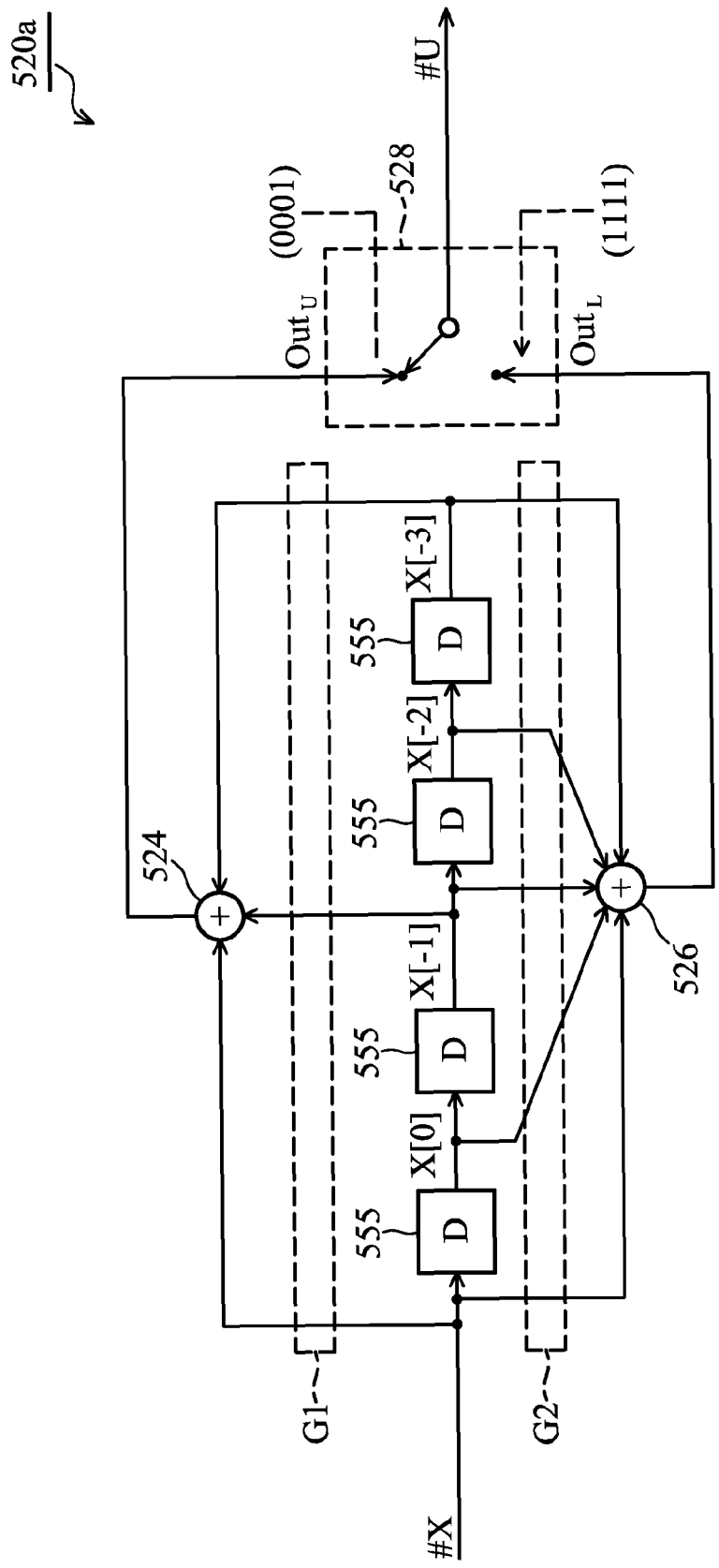

FIG. 5b shows a punctured binary convolutional encoder 520a according to the inner encoder 500 in FIG. 5a. The punctured binary convolutional encoder 520b has a structure similar to that of the punctured binary convolutional encoder 520a and will not be described again. It is noted that the error-check equation deduced in the following discussion can also be applied to the punctured binary convolutional encoder 520b. The punctured binary convolutional encoder 520a includes four delay elements 555, two exclusive-OR logic gates 524 and 526, and a commutator 528. The four delay elements 555 store four previous input bits X[0], X[−1], X[−2] and X[−3], and there are 16 states in the punctured binary convolutional encoder 520a. As shown in FIG. 5b, codes $OUT_U$ and $OUT_L$ can be expressed by:

$$OUT_U = X[1] \oplus X[-1] \oplus X[-3]; \quad (5); \text{ and}$$

$$OUT_L = X[1] \oplus X[0] \oplus X[-1] \oplus X[-2] \oplus X[-3] \quad (6).$$

Equations (5) and (6) are determined by generating codes G1 and G2, where G1=[010101] and G2=[011111]. It is noted that different convolutional coders have different generating codes. The Commutator 528 implements the puncture function using puncture matrix [P1;P2]=[0001;1111], where "0" indicates no transmission and "1" indicate transmission in order.

For each trellis group, the punctured binary convolutional encoder 520a can generate 8 encoded bits from 4 input bits represented by X[1], X[2], X[3] and X[4]. The commutator 528 selects 5 bits from the 8 encoded bits to be the coded stream #U according to the puncture matrix. Here a group of the coded stream (for example, [5],U[4],U[3],U[2],U[1]) can be expressed as functions of a corresponding group of the input bits (for example, X[4],X[3],X[2],X[1]) and previous input bits (or internal states of the encoder, X[0],X[−1],X[−2],X[−3]). Generally, in an n-th group, the five output bits can be expressed by:

$$U[n+1] = X[n+1] \oplus X[n] \oplus X[n-1] \oplus X[n-2] \oplus X[n-3];$$

$$U[n+2] = X[n+2] \oplus X[n+1] \oplus X[n] \oplus X[n-1] \oplus X[n-2];$$

$$U[n+3] = X[n+3] \oplus X[n+2] \oplus X[n+1] \oplus X[n] \oplus X[n-1];$$

$$U[n+4] = X[n+4] \oplus X[n+2] \oplus X[n]; \text{ and}$$

$$U[n+5] = X[n+4] \oplus X[n+3] \oplus X[n+2] \oplus X[n+1] \oplus X[n],$$

wherein n represents an index. In addition to the n-th group, two previous groups (the (n−2)-th and (n−1)-th groups) and two following groups (the (n+1)-th and (n+2)-th groups) are also listed for reference:

The (n−2)-th Group:

$$U[n-9] = X[n-7] \oplus X[n-8] \oplus X[n-9] \oplus X[n-10] \oplus X[n-11];$$

$$U[n-8] = X[n-6] \oplus X[n-7] \oplus X[n-8] \oplus X[n-9] \oplus X[n-10];$$

$$U[n-7] = X[n-5] \oplus X[n-6] \oplus X[n-7] \oplus X[n-8] \oplus X[n-9];$$

$$U[n-6] = X[n-4] \oplus X[n-6] \oplus X[n-8]; \text{ and}$$

$$U[n-5] = X[n-4] \oplus X[n-5] \oplus X[n-6] \oplus X[n-7] \oplus X[n-8];$$

The (n−1)-th Group:

$$U[n-4] = X[n-3] \oplus X[n-4] \oplus X[n-5] \oplus X[n-6] \oplus X[n-7];$$

$$U[n-3] = X[n-2] \oplus X[n-3] \oplus X[n-4] \oplus X[n-5] \oplus X[n-6];$$

$$U[n-2] = X[n-1] \oplus X[n-2] \oplus X[n-3] \oplus X[n-4] \oplus X[n-5];$$

$$U[n-1] = X[n] \oplus X[n-2] \oplus X[n-4]; \text{ and}$$

$$U[n] = X[n] \oplus X[n-1] \oplus X[n-2] \oplus X[n-3] \oplus X[n-4];$$

The (n+1)-th Group:

$$U[n+6] = X[n+5] \oplus X[n+4] \oplus X[n+3] \oplus X[n+2] \oplus X[n+1];$$

$$U[n+7] = X[n+6] \oplus X[n+5] \oplus X[n+4] \oplus X[n+3] \oplus X[n+2];$$

$$U[n+8] = X[n+7] \oplus X[n+6] \oplus X[n+5] \oplus X[n+4] \oplus X[n+3];$$

$$U[n+9] = X[n+8] \oplus X[n+6] \oplus X[n+4]; \text{ and}$$

$$U[n+10] = X[n+8] \oplus X[n+7] \oplus X[n+6] \oplus X[n+5] \oplus X[n+4]; \text{ and}$$

The (N+2)-th Group:

$$U[n+11] = X[n+9] \oplus X[n+8] \oplus X[n+7] \oplus X[n+6] \oplus X[n+5];$$

$$U[n+12] = X[n+10] \oplus X[n+9] \oplus X[n+8] \oplus X[n+7] \oplus X[n+6];$$

$$U[n+13] = X[n+11] \oplus X[n+10] \oplus X[n+9] \oplus X[n+8] \oplus X[n+7];$$

$$U[n+14] = X[n+12] \oplus X[n+10] \oplus X[n+8]; \text{ and}$$

$$U[n+6] = X[n+5] \oplus X[n+4] \oplus X[n+3] \oplus X[n+2] \oplus X[n+1].$$

According to the five consecutive groups of the output bits, an identity, irrelevant to the input bits X, can be deduced as follows:

$$U[n-6] \oplus U[n-5] \oplus U[n-4] \oplus U[n-3] \oplus U[n-2] \oplus U[n-1] \oplus U[n+1] \oplus U[n+4] \oplus U[n+5] \oplus U[n+8] \oplus U[n+9] \oplus U[n+11] \oplus U[n+12] \oplus U[n+13] \oplus U[n+14] \oplus U[n+15] = 0;$$

which can be further be deduced in a polynomial form, expressed as:

$$P(x) = x * (1 + x + x^2 + x^3 + x^4 + x^6 + x^7 + x^{10} + x^{11} + x^{14} + x^{16} + x^{17} + x^{18} + x^{19} + x^{20} + x^{21}) \quad (7).$$

Using the error-check equation (7) inherent in the transmitter complying with the J83B standard, a combinational logic unit 320 of FIG. 3a can be designed.

On the other hand, in the receiver of the J83B cable system, it is necessary to ascertain the puncture boundary or punctured position from an incoming bit stream since there is no training sequence therein. As illustrated, a group of five output coded bits is generated by four input bits, indicating five possible punctured positions for the incoming bit stream of the TCM decoder in the receiver. Thus, the error-check equation (7) can only be applied at a correct punctured position (puncture boundary) among the five possible punctured positions.

Figure 5C:
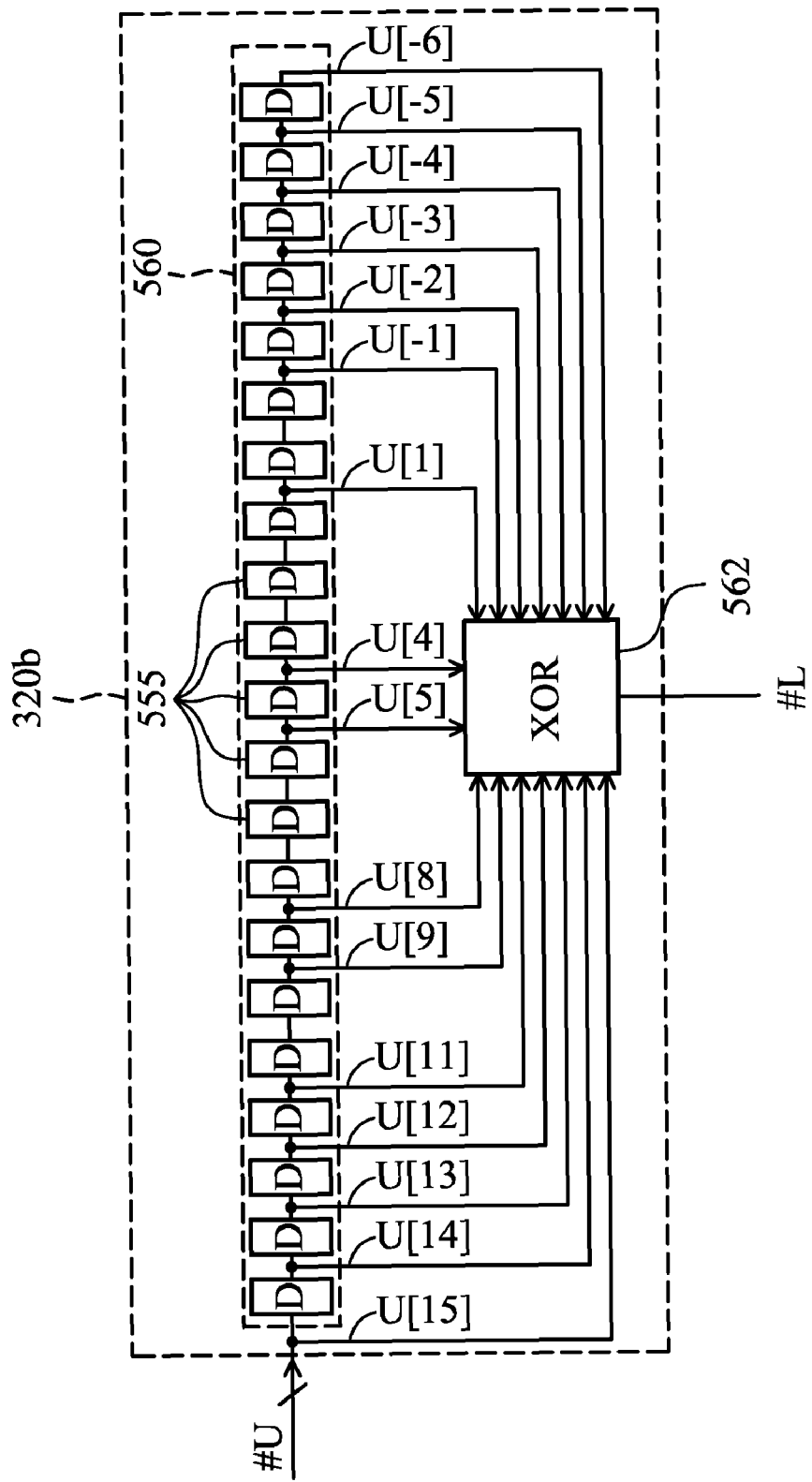
FIG. 5c shows an embodiment of a combinational logic unit 320b responsive to the punctured binary convolutional encoder 520a in FIG. 5b.

FIG. 5c shows an embodiment of a combinational logic unit 320b responsive to the punctured binary convolutional encoder 520a in FIG. 5b, which complies with the J83B standard and utilizes the error-check equation (7) to examine correctness of the data stream #S. In the digital communication device 200, a radio frequency signal #RF is received and consecutively demodulated by a demodulator 110 into a data stream #S, using a 64-QAM demodulation scheme in this embodiment. The combinational logic unit 320b includes a delay line 560 having a plurality of delay elements D connected in series, and an XOR gate 562 having a plurality of inputs respectively coupled to the outputs of a part of the delay elements D of the delay line circuit delay line 560. The decision unit 310 of FIG. 3a receives the in-phase and quadrature parts of the data stream #S to reacquire coded streams #U and #V as discussed in FIG. 5a. In the embodiment, only the coded stream #U is illustrated.

The coded stream #U is sent to the combinational logic unit 320b. In the combinational logic unit 320b, the delay line 560 stores a finite sequence of the coded stream using a plurality of unit delay elements D connected in series. In the embodiment, the delay line 560 has 21 unit delay elements to store the sequence from $U[n-6]$ to $U[n+14]$ of the coded stream #U. According to the error-check equation (7), the outputs of the first (Right), second, third, fourth, fifth, sixth, eighth, eleventh, twelfth, fifteenth, sixteenth, eighteenth, nineteenth, twentieth, and twenty-first (Left) unit delay elements and the current bit are connected to the inputs of the XOR gate 562. The XOR gate 562 consecutively performs XOR operation on these inputs to output a plurality of consecutive logic value #Ls. Each logic value #L represents a result of the error-check equation (7).

Figure 5D:
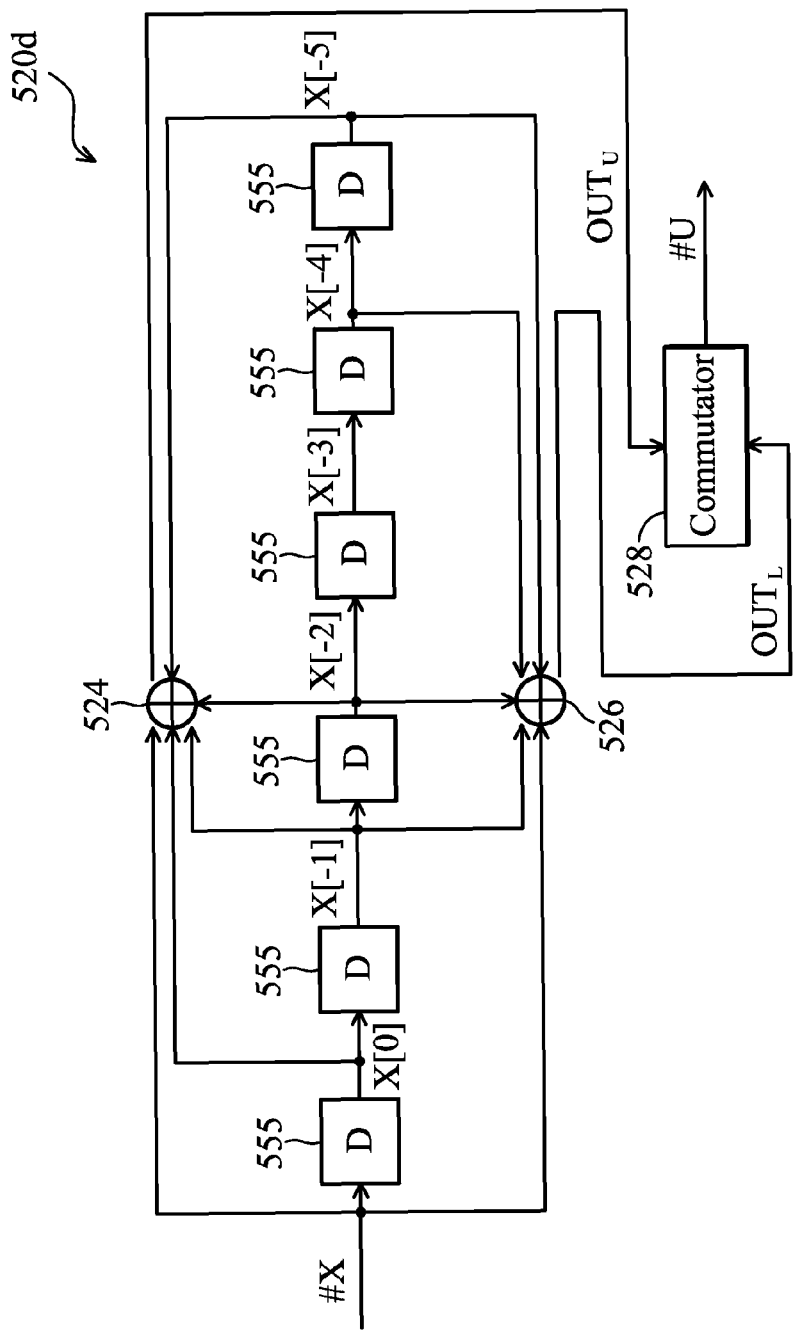

Alternatively, the burst error detector 300 can be widely used in all applications for burst error detection. For example, FIG. 5d shows a convolutional encoder 520d defined by Digital Video Broadcasting (DVB) standard ETSI EN 300 744 V1.4.1 (2001-01) with variable puncture rates including ½, ⅔ and ¾. The punctured convolutional encoder 520d includes six delay elements 555, two exclusive-OR gates 524 and 526, and a commutator 528. The six delay elements 555 store six previous input bits $X[0]$, $X[-1]$, $X[-2]$, $X[-3]$, $X[-4]$ and $X[-5]$. As shown, codes $OUT_U$ and $OUT_L$ input to the commutator 528 can be expressed by:

$$OUT_U = X[1] \oplus X[0] \oplus X[-1] \oplus X[-2] \oplus X[-5]; \quad (8)$$

$$OUT_L = X[1] \oplus X[-1] \oplus X[-2] \oplus X[-4] \oplus X[-5] \quad (9)$$

The European DVB standard suggests three options for punctured code rates, including ½, ⅔ and ¾. According to equations (8) and (9) and a specific punctured code rate, at least one identity equation merely involving the output bits and its parity check polynomial can be found. The deduction is omitted here for clarity.

When the puncture rate is set to ½, the puncture sequences [1-up 1-down] can be expressed as:

$$U[1]=X[1]+X[0]+X[-1]+X[-2]+X[-5];$$

$$U[2]=X[1]+X[-1]+X[-2]+X[-4]+X[-5]; \text{ and}$$

$$U[3]=X[2]+X[1]+X[0]+X[-1]+X[-4].$$

Similarly, $U[4]\sim U[16]$ can also be obtained from the puncture sequences. Therefore, based on $U[1]\sim U[16]$, an identity can be derived, expressed as:

$$U[1] \oplus U[2] \oplus U[4] \oplus U[5] \oplus U[7] \oplus U[8] \oplus U[11] \oplus U[13] \oplus U[15] \oplus U[16]=0;$$

where an error-check equation can be induced therefrom, expressed in polynomial form:

$$P(x)=1+x+x^3+x^5+x^8+x^9+x^{11}+x^{12}+x^{14}+x^{15} \quad (10).$$

When the puncture rate is set to ⅔, the puncture sequence [1-up 1-down 2-down] can be expressed as:

$$U[1]=X[1]+X[0]+X[-1]+X[-2]+X[-5];$$

$$U[2]=X[1]+X[-1]+X[-2]+X[-4]+X[-5];$$

$$U[3]=X[2]+X[0]+X[-1]+X[-3]+X[-4]; \text{ and}$$

$$U[4]=X[3]+X[2]+X[1]+X[0]+X[-3].$$

Similarly, $U[5]\sim U[20]$ can also be obtained from the puncture sequences. Therefore, according to $U[1]$ to $U[20]$ of rate ⅔, a corresponding error-check equation can be derived:

$$U[1] \oplus U[2] \oplus U[3] \oplus U[4] \oplus U[8] \oplus U[10] \oplus U[12] \oplus U[13] \oplus U[15] \oplus U[18] \oplus U[19] \oplus U[20]=0;$$

where the polynomial form is expressed as:

$$P(x)=1+X+x^2+x^5+x^7+x^8+x^{10}+x^{12}+x^{16}+x^{17}+x^{18}+x^{19} \quad (11).$$

Furthermore, when the puncture rate is set to ¾, the puncture sequence [1-up 1-down 2-down 3-up] can be expressed as:

$$U[1]=X[1]+X[0]+X[-1]+X[-2]+X[-5];$$

$$U[2]=X[1]+X[-1]+X[-2]+X[-4]+X[-5];$$

$$U[3]=X[2]+X[0]+X[-1]+X[-3]+X[-4];$$

$$U[4]=X[3]+X[2]+X[1]+X[0]+X[-3]; \text{ and}$$

$$U[5]=X[4]+X[3]+X[2]+X[1]+X[-2].$$

Similarly, $U[6]\sim U[34]$ can also be obtained from the puncture sequences. Therefore, according to the $U[1]$ to $U[34]$ of rate ¾, the identity can be:

$$U[1] \oplus U[2] \oplus U[3] \oplus U[4] \oplus U[7] \oplus U[10] \oplus U[14] \oplus U[15] \oplus U[16] \oplus U[24] \oplus U[28] \oplus U[29] \oplus U[31] \oplus U[32] \oplus U[33] \oplus U[34]=0;$$

where the polynomial form is expressed as:

$$P(x)=1+x+x^2+x^3+x^5+x^6+x^{10}+x^{18}+x^{19}+x^{20}+x^{24}+x^{27}+x^{30}+x^{31}+x^{32}+x^{33} \quad (12).$$

Inherently, the structure proposed in FIG. 5c can be alternated to implement various error-check equations such as (10), (11) and (12).

Figure 6:
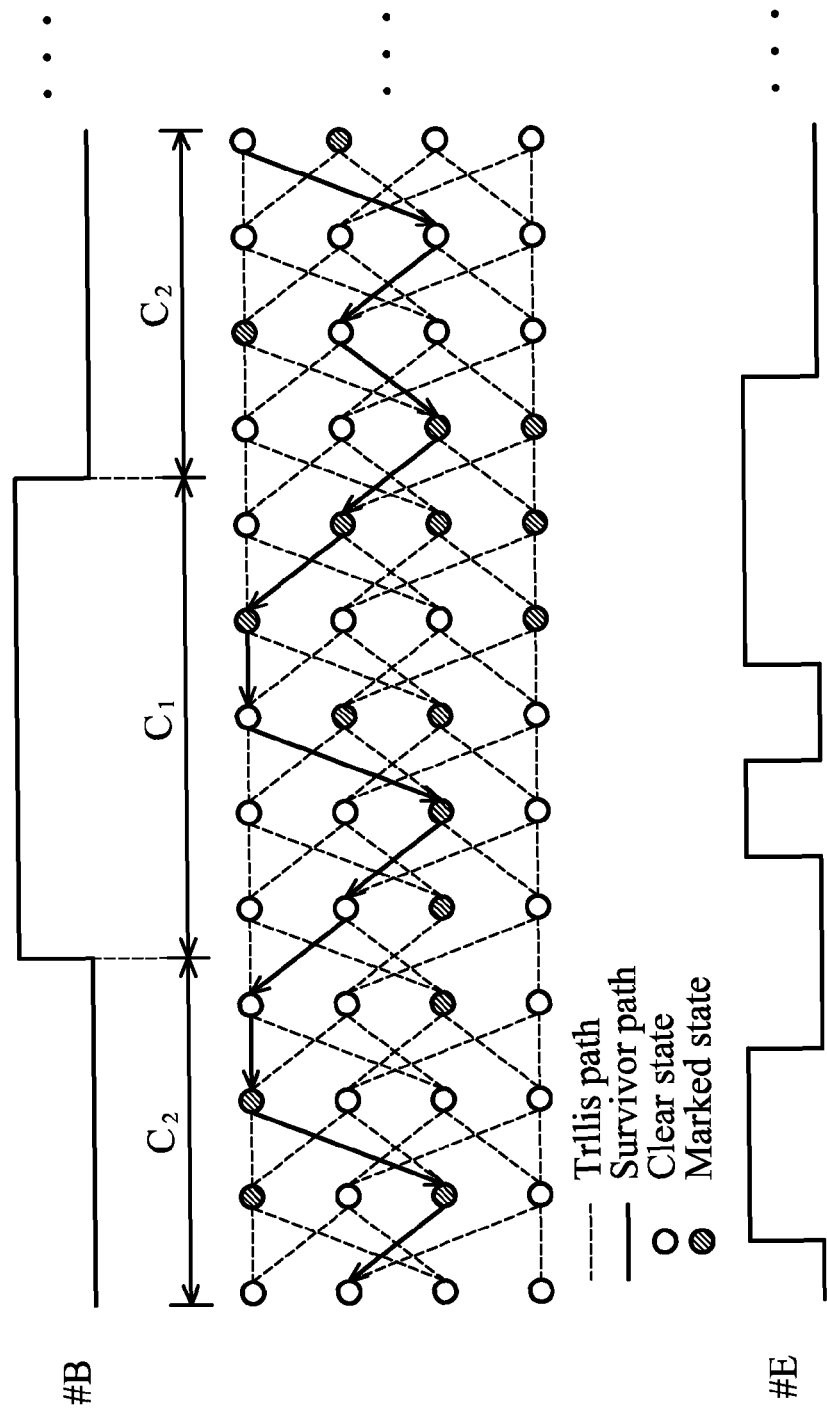
FIG. 6 shows an embodiment of an erasure marking process.

FIG. 6 shows an embodiment of an erasure marking process implemented by the erasure marker 225 of FIGS. 2a and 2b. The upper part of FIG. 6 illustrates the status of the burst error indicator #B. During period C1, the burst error indicator #B is high, indicating that burst error has occurred. During periods C2, the burst error indicator #B is low, indicating that no burst error has occurred.

As an example, the inner decoder 220 of FIGS. 2a and 2b may adopt the Viterbi algorithm to decode the data stream #S, and the middle part of FIG. 6 shows a survivor path found in a trace back procedure performed by the inner decoder 220 to thereby decode the inner decoded stream #I therefrom. The erasure marking process is performed during the Viterbi decoding process. Since burst error occurs during period C1, a higher criterion is used for determining an erasure. The marked states are represented in shadowed nodes. Conversely, the survivor paths are more reliable during period C2, so a lower criterion is used to determine an erasure. The lower part of FIG. 6 illustrates how the signal states of the erasure indicator #E are determined according to marks on the survivor path on the Trellis diagram. If a state is marked on the survivor path, the erasure marker 225 correspondingly asserts an erasure indicator #E of logic "1". Conversely, for a state on the survivor path without a mark, the erasure marker 225 correspondingly asserts a logic "0".

The embodiment of FIG. 6 enables the outer decoder 240a of FIG. 2a to decode the deinterleaved stream #D in accordance with unreliable locations specified by the deinterleaved erasure indicator #E' as erasure locations corresponding to the deinterleaved stream #D, wherein the deinterleaved erasure indicator #E' is generated from the deinterleaver 230 of FIG. 2a by deinterleaving the erasure indicator #E. Similarly, the embodiment of FIG. 6 is applicable to the outer decoder 240b of FIG. 2b to decode inner decoded stream #I in accordance with unreliable locations specified by the erasure indicator #E as erasure locations corresponding to the inner decoded stream #I.

Figure 7A:
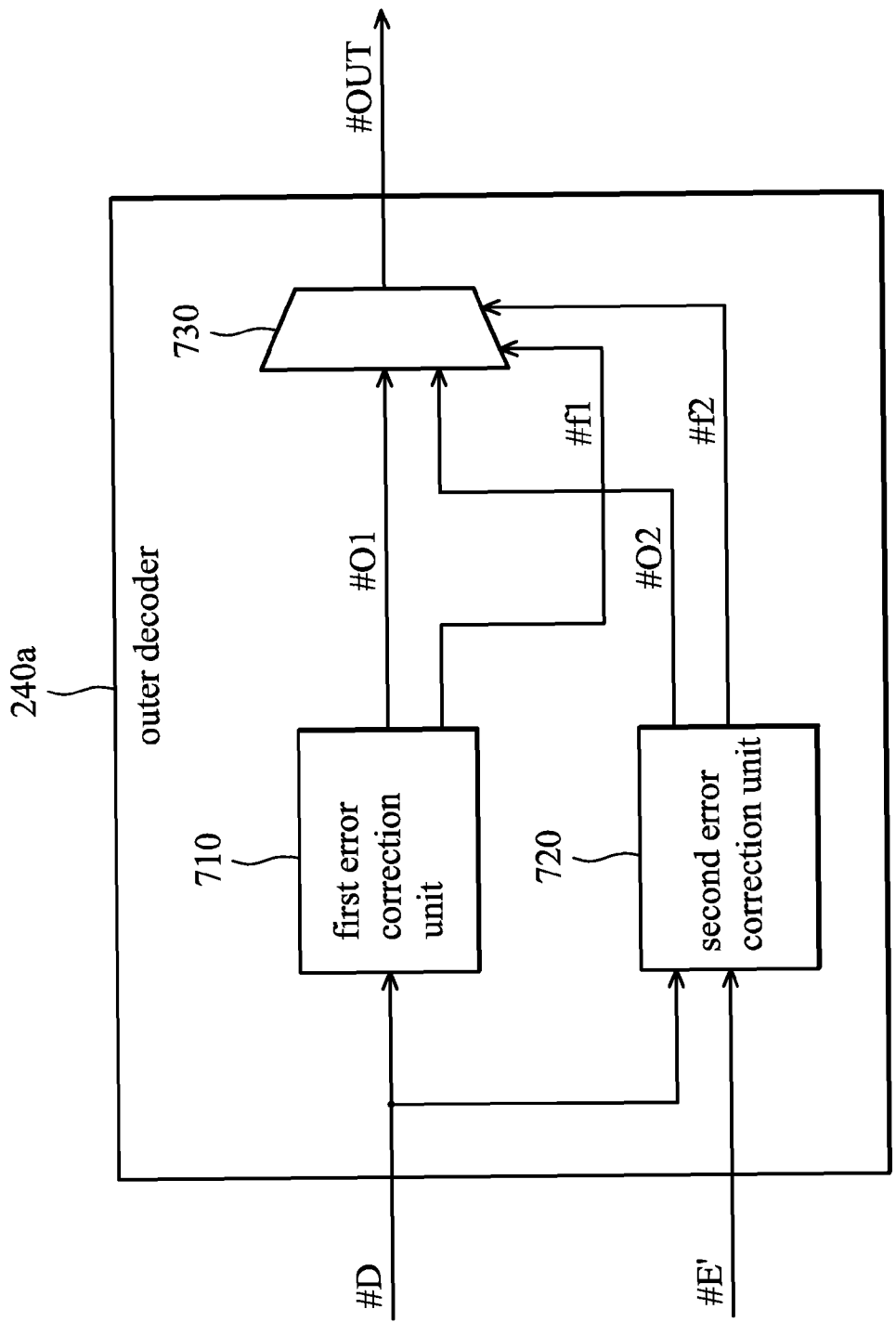

FIG. 7a shows an outer decoder 240a for error-correcting a deinterleaved stream #D to generate a receiver output #OUT according to an embodiment of the invention. The deinterleaved stream #D is an (n, k, 2t) RS encoded signal. The outer decoder 240a includes a first error correction unit 710, a second error correction unit 720 and a multiplexer 730. As discussed, the digital communication device 200a of FIG. 2a is a concatenated code receiver, and the erasure marker 225 functions with reference to burst noise locations determined by a burst error detector 300 coupled to the demodulator 110, and the deinterleaved erasure indicator #E' generated by the deinterleaver 130 indicates unreliable-locations of the deinterleaved stream #D while performing the decoding.

In the outer decoder 240a, a first error correction unit 710 decodes the deinterleaved stream #D to generate a first preliminary output #O1. Since the first error correction unit 710 functions without reference to the deinterleaved erasure indicator #E', the performance of the first error correction unit 710 will not be influenced by an erroneous erasure marking procedure possibly performed by the erasure marker 225. The first error correction unit 710 can correct a maximum of t errors per codeword. On the other hand, the second error correction unit 720 decodes the deinterleaved stream #D with reference to the deinterleaved erasure indicator #E' to generate a second preliminary output #O2. More specifically, the second error correction unit 720 decodes the deinterleaved stream #D by regarding the unreliable-locations indicated by the deinterleaved erasure indicator #E' as erasure locations. A total of x errors and y erasures of a codeword can be corrected successively only if $2x+y \leq 2t$. That is, with the additional information provided by the deinterleaved erasure indicator #E', it is possible that the second error correction unit 720 can correct a maximum of 2t erasures. In other words, if all error locations of a codeword can be precisely determined by the erasure marker 225 as erasure locations and no erroneous erasure locations are marked, the second error correction unit 720 will be able to correct a maximum of 2t errors, which means twice the error correcting capability of the first error correction unit 710.

In this embodiment, the first error correction unit 710 and the second error correction unit 720 function in parallel. For each codeword of the deinterleaved stream #D, both the first error correction unit 710 and the second error correction unit 720 attempt to decode the codeword to respectively generate the first preliminary output #O1 and second preliminary output #O2. This strategy ensures the error-correcting capability of the outer decoder 240a when the number of errors in a codeword of the deinterleaved stream #D is not larger than t, and enhances the error-correcting capability of the outer decoder 240a when the number of errors in a codeword of the deinterleaved stream #D is larger than t.

In addition, when decoding codewords of the deinterleaved stream #D, the first error correction unit 710 further generates a first flag #f1 to indicate whether each codeword of the deinterleaved stream #D is successively error-corrected by the first error correction unit 710. Similarly, when decoding codewords of the deinterleaved stream #D with reference to the deinterleaved erasure indicator #E', the second error correction unit 720 also generates a second flag #f2 to indicate whether each codeword of the deinterleaved stream #D is successively error-corrected by the second error correction unit 720. According to the first flag #f1 and second flag #f2, the multiplexer 730 selects one of the first preliminary output #O1 and second preliminary output #O2 to be the receiver output #OUT.

Since the first error correction unit 710 is a relatively reliable decoder and will not be influenced by an erroneous erasure marking procedure possibly performed by the erasure marker 225, as long as the first flag #f1 indicates that the deinterleaved stream #D is successively error-corrected by the first error correction unit 710 to generate the first preliminary output #O1, the multiplexer 730 may selects the first preliminary output #O1 to be the receiver output #OUT.

In the embodiment, the deinterleaver 230 is not limited to be an essential component. Generally, the deinterleaver 230 is set in front of the input ends of the first error correction unit 710 and the second error correction unit 720, to deinterleave the inner decoded stream #I output from the inner decoder 220 before the deinterleaved stream #D is inputted into the first error correction unit 710 and the second error correction unit 720, and to deinterleave the erasure indicator #E, thereby generating the deinterleaved erasure indicator #E' and providing it to the second error correction unit 720. Alternatively, as shown in FIG. 2b, the outer decoder 240b may directly connect to the inner decoder 220, processing the inner decoded stream #I instead of the deinterlaved stream #D.

Figure 7B:
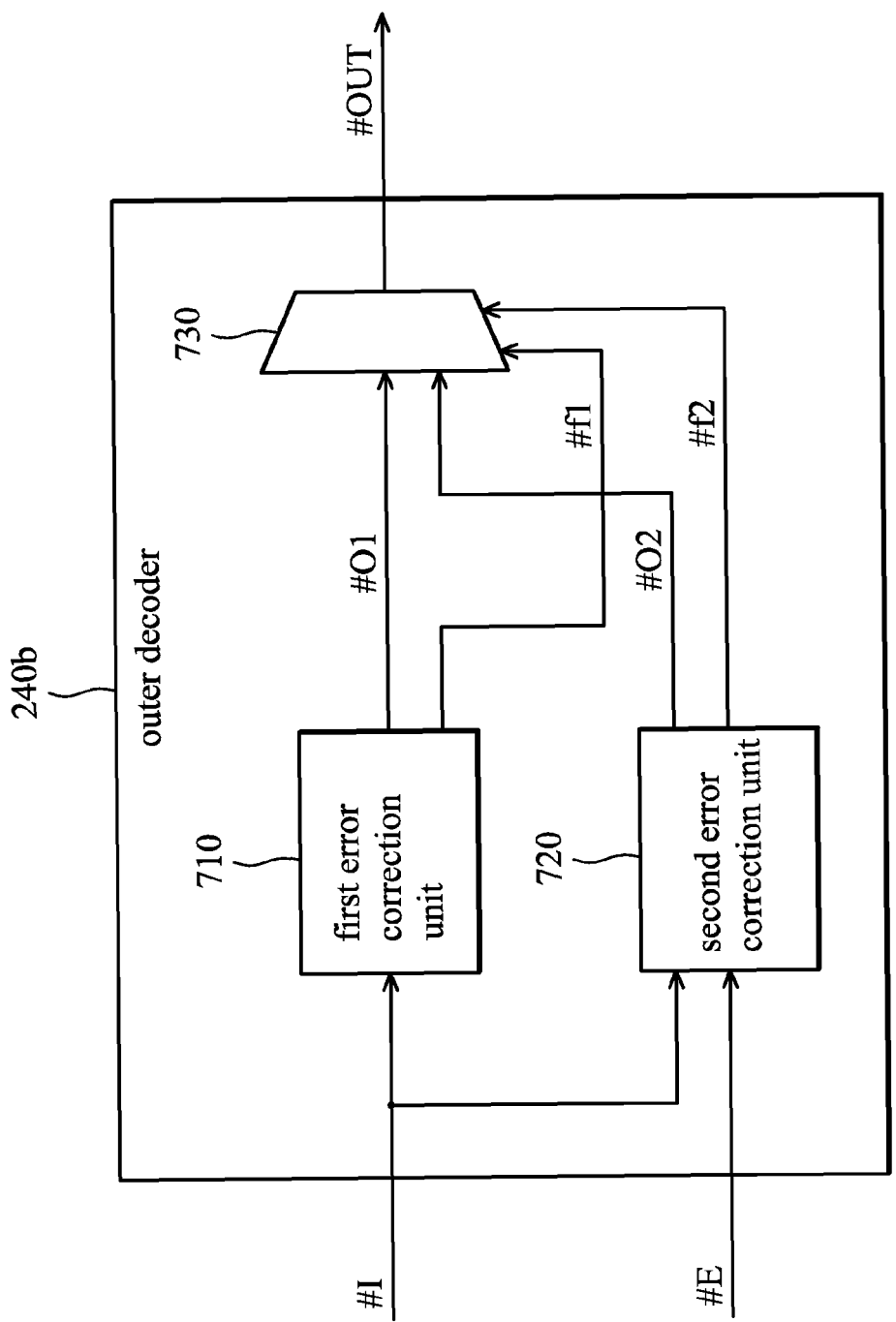
FIG. 7b shows another embodiment of an outer decoder 240b.

FIG. 7b shows an outer decoder 240b similar to the embodiment of FIG. 7a. The outer decoder 240b is adaptable in the embodiment of FIG. 2b where the deinterleaver 230 is skipped, operating based on the erasure indicator #E and the inner decoded stream #I. The first error correction unit 710 decodes the inner decoded stream #I to generate a first preliminary output #O1, and the second error correction unit 720 decodes the inner decoded stream #I with reference to the erasure indicator #E to generate a second preliminary output #O2. More specifically, the second error correction unit 720 decodes the inner decoded stream #I by regarding the unreliable-locations indicated by the erasure indicator #E as erasure locations. When decoding codewords of the inner decoded stream #I, the first error correction unit 710 further generates a first flag #f1 to indicate whether each codeword of the inner decoded stream #I is successively error-corrected by the first error correction unit 710. Similarly, when decoding codewords of the inner decoded stream #I with reference to the erasure indicator #E, the second error correction unit 720 also generates a second flag #f2 to indicate whether each codeword of the inner decoded stream #I is successively error-corrected by the second error correction unit 720. According to the first flag #f1 and second flag #f2, the multiplexer 730 selects one of the first preliminary output #O1 and second preliminary output #O2 to be the receiver output #OUT. Those skilled in the art are able to realize how the outer decoder 240b performs these operations and functions based on the above descriptions directed to the outer decoder 240a. Therefore, the detailed descriptions for these operations and functions are not repeated herein.

While the invention has been described by way of example and in terms of preferred embodiment, it is to be understood that the invention is not limited thereto. To the contrary, it is intended to cover various modifications and similar arrange-

What is claimed is:

1. A digital communication device for decoding a data stream to generate a receiver output, comprising:
   a burst error detector for determining burst noise locations corresponding to the data stream according to an error-check equation and accordingly generating a burst error indicator;
   an inner decoder for decoding the data stream to generate an inner decoded stream, comprising an erasure marker for performing an erasure marking process on the inner decoded stream based on the burst error indicator to generate an erasure indicator corresponding to the inner decoded stream; and
   an outer decoder, coupled to the inner decoder, for decoding the inner decoded stream with reference to the erasure indicator to generate the receiver output.

2. The digital communication device of claim 1, wherein the erasure marker adopts one of a plurality of determining criteria according to the burst error indicator to perform the erasure marking process to generate the erasure indicator.

3. The digital communication device of claim 1, wherein:
   when the burst error detector asserts the burst error indicator to a first value, the erasure marker adopts a first determining criterion to perform the erasure marking process on the inner decoded stream; and
   when the burst error detector asserts the burst error indicator to a second value, the erasure marker adopts a second determining criterion to perform the erasure marking process on the inner decoded stream.

4. The digital communication device of claim 1, further comprises a deinterleaver, coupled to the inner decoder and outer decoder, deinterleaving the inner decoded stream and the erasure indicator to generate a deinterleaved stream and a deinterleaved erasure indicator corresponding to the deinterleaved stream respectively, wherein the outer decoder decodes the deinterleaved stream with reference to the deinterleaved erasure indicator to generate the receiver output.

5. The digital communication device of claim 1, wherein the outer decoder comprises:
   a first error correction unit for error-correcting the inner decoded stream to generate a first preliminary output;
   a second error correction unit for error-correcting the inner decoded stream with reference to the erasure indicator to generate a second preliminary output; and
   a multiplexer coupled to the first error correction unit and the second error correction unit, for selecting one of the first and the second preliminary outputs to be the receiver output.

6. The digital communication device of claim 5, wherein the second error correction unit decodes the inner decoded stream by regarding unreliable locations specified by the erasure indicator as erasure locations corresponding to the inner decoded stream.

7. The digital communication device of claim 6, wherein:
   the first error correction unit further generates a first flag indicating whether the inner decoded stream was successively error-corrected by the first error correction unit;
   the second error correction unit further generates a second flag indicating whether the inner decoded stream was successively error-corrected by the second error correction unit; and
   the multiplexer selects one of the first preliminary output and the second preliminary output to be the receiver output according to the first flag and the second flag.

8. The digital communication device of claim 1, wherein the data stream complies with the 8-level vestigial sideband (8-VSB) standard, comprising parallel coded bits U0, U1 and U2, where U0 represents a parity of U1, expressed as:
   U0[n+1]=U1[n]⊕U0[n−1], where n represents a time slot, and the operator ⊕ represents an XOR operation; and
   the error-check equation is expressed by:
   P[n]=U0[n+1]⊕U1[n]⊕U0[n−1], where P[n] represents the logic value with "0" indicating the coded stream is correct, and "1" indicating the coded stream is incorrect.

9. The digital communication device of claim 1, wherein the data stream complies with the standard of the ITU-T Recommendation J.83 Annex B, and the error-check equation is a parity check polynomial P(x) expressed by: P(x)=x*(1+x+x2+x3+x4+x6+x7+x10+x11+x14+x16+x17+x18+x19+x20+x21).

10. The digital communication device of claim 1, wherein the data stream complies with the Digital Video Broadcasting (DVB) Standard, and the error-check equation is a parity check polynomial P(x) expressed by: P(x)=1+x+x3+x5+x8+x9+x11+x12+x14+x15 when the data stream has a code rate of ½, P(x)=1+x+x2+x5+x7+x8+x10+x12+x16+x17+x18+x19 when the data stream has a code rate of ⅔, and P(x)=1+x+x2+x3+x5+x6+x10+x18+x19+x20+x24+x27+x30+x31+x32+x33, when the data stream has a code rate of ¾.

11. The digital communication device of claim 1, wherein the burst error detector comprises:
   a decision unit, receiving the data stream to generate at least one coded stream;
   a combinational logic unit, coupled to the decision unit, for performing a combinational logic operation on the coded stream based on the error-check equation to generate a logic value for indicating correctness of the coded stream;
   a statistics unit, coupled to the combinational logic unit, for compiling a plurality of consecutive logic values within a time period to generate an accumulated value; and
   a comparator, coupled to the statistics unit, comparing the accumulated value with a threshold level to generate the burst error indicator indicating whether a burst error corresponding to the time period has occurred.

12. The digital communication device of claim 11, wherein the combinational logic unit comprises:
   a delay line, having a plurality of delay elements connected in series for storing a finite sequence of the bit stream; and
   an XOR gate, having a plurality of inputs, selectively receiving outputs from the delay elements to implement the error-check equation, such that selected outputs from the delay elements perform an XOR operation to generate the logic value.

13. The digital communication device of claim 11, wherein the statistics unit comprises:
   a delay line comprising a plurality of columns each corresponding to a slot in the time period, for storing preliminary accumulation results of the accumulated value;
   an adder for recursively and sequentially accumulating each column with each sequentially input logic value; and
   a selector for detecting a boundary of the data stream and outputting one of the preliminary accumulation results as the accumulated value based on the boundary.

14. The digital communication device of claim 13, wherein when the accumulations for each column are repeated for at least one time periods, the selector selects one of the columns having a minimal preliminary accumulation result as the boundary and outputs the preliminary accumulation result as the accumulated value according to the boundary.

15. The digital communication device of claim 11, wherein the statistics unit comprises:
   an adder for summing each sequentially input logic value from the combinational logic unit with a preliminary accumulation result as the preliminary accumulation result;
   a storage element for storing the preliminary accumulation result from the adder; and
   a counter for enabling output of the preliminary accumulation result in the storage element as the accumulated value for each time period.

16. The digital communication device of claim 11, further comprising a demodulator, receiving a radio frequency signal and demodulating the radio frequency signal to generate the data stream.

17. A method for decoding a data stream to generate a receiver output, comprising:
   determining burst noise locations corresponding to the data stream according to an error-check equation and accordingly generating a burst error indicator;
   decoding the data stream to generate an inner decoded stream;
   performing an erasure marking process on the inner decoded stream based on the burst error indicator to generate an erasure indicator corresponding to the inner decoded stream; and
   decoding the inner decoded stream with reference to the erasure indicator to generate the receiver output.

18. The method as claimed in claim 17, wherein the erasure marking process comprises adopting one of a plurality of determining criteria according to the burst error indicator to generate the erasure indicator.

19. The method as claimed in claim 17, further comprising:
   when the burst error indicator is asserted to a first value, adopting a first determining criterion to perform the erasure marking process on the inner decoded stream; and
   when the burst error indicator is asserted to a second value, adopting a second determining criterion to perform the erasure marking process on the inner decoded stream.

20. The method as claimed in claim 17, further comprising:
   deinterleaving the inner decoded stream and the erasure indicator to generate a deinterleaved stream and a deinterleaved erasure indicator corresponding to the deinterleaved stream respectively; and
   decoding the deinterleaved stream with reference to the deinterleaved erasure indicator to generate the receiver output.

21. The method as claimed in claim 17, wherein decoding the inner decoded stream comprises:
   performing a first error correction on the inner decoded stream to generate a first preliminary output;
   performing a second error correction on the inner decoded stream with reference to the deinterleaved erasure indicator to generate a second preliminary output; and
   selecting one of the first and the second preliminary outputs to be the receiver output.

22. The method as claimed in claim 21, wherein the second error correction comprises decoding the inner decoded stream by regarding unreliable locations specified by the erasure indicator as erasure locations corresponding to the inner decoded stream.

23. The method as claimed in claim 17, wherein the data stream complies with the 8-level vestigial sideband (8-VSB) standard, comprising parallel coded bits U0, U1 and U2, where U0 represents a parity of U1, expressed as:
   $U0[n+1]=U1[n]\oplus U0[n-1]$, where n represents a time slot, and the operator $\oplus$ represents an XOR operation; and
   the error-check equation is expressed by:
   $P[n]=U0[n+1]\oplus U1[n]\oplus U0[n-1]$, where P[n] represents the logic value with "0" indicating, the coded stream is correct, and "1" indicating the coded stream is incorrect.

24. The method as claimed in claim 17, wherein the data stream complies with the standard of the ITU-T Recommendation J.83 Annex B, and the error-check equation is a parity check polynomial P(x) expressed by: $P(x)=x*(1+x+x2+x3+x4+x6+x7+x10+x11+x14+x16+x17+x18+x19+x20+x21)$.

25. The method as claimed in claim 17, wherein the data stream complies with the Digital Video Broadcasting (DVB) Standard, and the error-check equation is a parity check polynomial P(x) expressed by: $P(x)=1+x+x3+x5+x8+x9+x11+x12+x14+x15$ when the data stream has a code rate of ½, $P(x)=1+x+x2+x5+x7+x8+x10+x12+x16+x17+x18+x19$ when the data stream has a code rate of ⅔, and $P(x)=1+x+x2+x3+x5+x6+x10+x18+x19+x20+x24+x27+x30+x31+x32+x33$, when the data stream has a code rate of ¾.

26. The method as claimed in claim 17, wherein determination of burst noise locations comprises:
   receiving the data stream to generate at least one coded stream;
   performing a combinational logic operation on the coded stream based on the error-check equation to generate a logic value for indicating correctness of the coded stream;
   compiling a plurality of consecutive logic values within a time period to generate an accumulated value; and
   comparing the accumulated value with a threshold level to generate the burst error indicator indicating whether a burst error corresponding to the time period has occurred.

27. The method as claimed in claim 17, further comprising: receiving a radio frequency signal and demodulating the radio frequency signal to generate the data stream.

* * * * *